US008120394B2

(12) United States Patent
Tarng et al.

(10) Patent No.: US 8,120,394 B2
(45) Date of Patent: Feb. 21, 2012

(54) AUTOMATIC FREQUENCY CALIBRATION CIRCUIT AND AUTOMATIC FREQUENCY CALIBRATION METHOD

(75) Inventors: Shih-Hao Tarng, Kaohsiung (TW); Jia-Hung Peng, Hsinchu (TW); Ming-Ching Kuo, Chiayi County (TW)

(73) Assignee: Industrial Technology Research Institute, Hsinchu (TW)

( * ) Notice: Subject to any disclaimer, the term of this patent is extended or adjusted under 35 U.S.C. 154(b) by 144 days.

(21) Appl. No.: 12/767,813

(22) Filed: Apr. 27, 2010

(65) Prior Publication Data

US 2011/0221489 A1    Sep. 15, 2011

(30) Foreign Application Priority Data

Mar. 11, 2010  (TW) .............................. 99107142 A

(51) Int. Cl.
*H03L 7/06*    (2006.01)
*G01R 23/00*   (2006.01)

(52) U.S. Cl. ........... 327/156; 327/159; 331/1 R; 331/10; 331/16; 331/36 C; 331/44; 331/179

(58) Field of Classification Search .................. 327/147, 327/150, 156, 159; 331/1 R, 10, 11, 16, 331/17, 36 C, 1 A, 44, 175, 177 V, 179
See application file for complete search history.

(56) References Cited

U.S. PATENT DOCUMENTS

| 6,566,966 | B1 | 5/2003 | Bellaouar et al. | |
| 6,639,474 | B2 | 10/2003 | Asikainen et al. | |
| 6,710,664 | B2 | 3/2004 | Humphreys et al. | |
| 7,047,146 | B2 | 5/2006 | Chuang et al. | |
| 7,064,591 | B1 | 6/2006 | Humphreys et al. | |
| 7,154,348 | B2 * | 12/2006 | Lee et al. | .......... 331/34 |
| 7,315,218 | B1 * | 1/2008 | Fernandez | ...................... 331/44 |
| 7,474,159 | B2 * | 1/2009 | Wang et al. | ..................... 331/16 |
| 7,746,182 | B2 * | 6/2010 | Ramaswamy et al. | .......... 331/44 |
| 7,982,552 | B2 * | 7/2011 | Shin et al. | .................. 331/177 R |
| 2005/0258906 | A1 * | 11/2005 | Su et al. | .......................... 331/10 |
| 2007/0264951 | A1 | 11/2007 | Cho et al. | |
| 2008/0106340 | A1 | 5/2008 | Lee et al. | |
| 2008/0157884 | A1 * | 7/2008 | Lee | ................................ 331/44 |
| 2011/0032011 | A1 * | 2/2011 | Kim et al. | ..................... 327/156 |

OTHER PUBLICATIONS

Authored by Marutani, et al, article titled "An 18mW 90 to 770MHz synthesizer with agile auto-tuning for digital TV-tuners," adopted from 2006 IEEE International Solid-State Circuits Conference, Feb. 7, 2006, totalling in 10 pages.

* cited by examiner

*Primary Examiner* — Patrick O'Neill
(74) *Attorney, Agent, or Firm* — Jianq Chyun IP Office

(57) ABSTRACT

An automatic frequency calibration circuit and an automatic frequency calibration method for a fractional-N frequency synthesizer are provided. In a calibration mode, a state machine adjusts a fractional part and an integer part of a division ratio of a frequency divider unit according to a required precision. A first and a second frequency detecting units detect a reference frequency and an output frequency of the frequency divider unit, respectively. A judging interval unit defines at least one judging period in a total comparison time. A comparator compares the outputs of the first and the second frequency detecting units and outputs a comparison result at the judging period. Wherein, the state machine changes the capacitor configuration of a voltage-controlled oscillator when the comparison result shows that the reference frequency does not match the output frequency of the frequency divider unit.

18 Claims, 7 Drawing Sheets

AUTOMATIC FREQUENCY CALIBRATION CIRCUIT AND AUTOMATIC FREQUENCY CALIBRATION METHOD

CROSS-REFERENCE TO RELATED APPLICATION

This application claims the priority benefit of Taiwan application serial no. 99107142, filed on Mar. 11, 2010. The entirety of the above-mentioned patent application is hereby incorporated by reference herein and made a part of specification.

BACKGROUND OF THE INVENTION

1. Technical Field

The present disclosure relates an automatic frequency calibration circuit and an automatic frequency calibration method.

2. Description of Related Art

In many electronic systems, a frequency synthesizer is required to provide a stable and specific frequency. The frequency synthesizer can dynamically adjust an output frequency according to an actual requirement. FIG. 1 is a circuit schematic diagram illustrating a voltage-controlled oscillator (VCO) 100 of a conventional frequency synthesizer. A control voltage VTUNE can change a capacitance of a varactor 110 in a resonant cavity of the VCO 100. By adjusting the capacitance of the varactor 110, an output frequency Fosc of the VCO 100 can be changed.

FIG. 2A is a circuit schematic diagram illustrating the varactor 110 of the VCO 100. For a wideband system, a relatively large varactor is required to be used in the resonant cavity of the VCO 100, so as to achieve all of the target frequencies Fosc. However, the large varactor corresponds to an increased oscillator gain. FIG. 2B is a schematic diagram illustrating a relationship curve of the control voltages VTUNE and the output frequencies Fosc in the large varactor 110 of FIG. 2A. Utilization of the large varactor 110 can increase a slope $K_{VCO}$ (i.e. the oscillator gain) of the relationship curve of FIG. 2B, which may increase a phase noise of the VCO 100.

FIG. 3A is a circuit schematic diagram illustrating another varactor 110 of the VCO 100. To satisfy a requirement of the wideband system, and meanwhile reduce the slope $K_{VCO}$ (i.e. the oscillator gain), when the wideband VCO 100 is designed, the varactor 110 of FIG. 3A can use a small varactor 111 in collaboration with a switched-capacitor bank 112, so as to achieve an enough bandwidth without increasing the oscillator gain. Namely, the VCO 100 has a plurality of capacitor configurations. By changing connection states of one or a plurality of switches in the switched-capacitor bank 112, various possible values of the capacitance can be achieved.

FIG. 3B is a schematic diagram illustrating relationship curves of the control voltages VTUNE and the output frequencies Fosc in the varactor 110 of FIG. 3A. As shown in FIG. 3B, a single tuning curve with a large slope can be converted into a plurality of curves with small slopes. Each of the curves in FIG. 3B corresponds to one of the aforementioned capacitor configurations. Namely, when the VCO 100 is set to one of the capacitor configurations, the VCO 100 is operated according to one of the curves of FIG. 3B. An automatic frequency calibration circuit is used for finding the tuning curve (i.e. finding the corresponding capacitor configuration) covering a target frequency before the frequency synthesizer is locked at the target frequency.

When the VCO 100 is applied to an integer-N frequency synthesizer, since a division ratio of a frequency divider is a fixed value, the automatic frequency calibration circuit can directly compare a reference frequency REF and an output frequency DIV of the frequency divider according to such division ratio, so as to find a suitable tuning curve. However, when the VCO 100 is applied to a fractional-N frequency synthesizer, since the division ratio of the frequency divider is constantly varied to achieve that an average thereof is in line with a precise fraction, when the reference frequency REF and the output frequency DIV of the frequency divider is compared, the conventional automatic frequency calibration circuit may have errors in the comparison.

Most of the currently known automatic frequency calibration circuits are designed in allusion to the integer-N frequency synthesizer, though if such conventional automatic frequency calibration circuit is applied to the fractional-N frequency synthesizer, a problem is probably occurred. Assuming an integer part and a fractional part of a target division ratio in the frequency synthesizer are respectively K and M, and the frequency found by the automatic frequency calibration circuit according to the target division ratio is $F_{afc}$, since when the conventional automatic frequency calibration circuit finds the most suitable tuning curve, only the integer part is considered, the found $F_{afc}$ is approximately K times of the reference frequency REF. However, after the calibration is completed, the locked frequency of the frequency synthesizer is K.M times of the reference frequency REF, so that there is 0.M times of error there between. Such error is probably as much as the reference frequency REF, which may lead to a result that the VCO 100 is locked at a control voltage with worse phase noise, or even cannot be locked.

SUMMARY

Accordingly, the embodiments of the present disclosure are directed to an automatic frequency calibration circuit and an automatic frequency calibration method for a fractional-N frequency synthesizer, in which a fractional part of a target division ratio is considered during frequency calibration.

The exemplary embodiment of the present disclosure provides an automatic frequency calibration circuit for a fractional-N frequency synthesizer, the frequency synthesizer has a voltage-controlled oscillator (VCO) and a frequency dividing unit, wherein the VCO has a plurality of capacitor configurations. The automatic frequency calibration circuit includes a first frequency detecting unit, a second frequency detecting unit, a comparator, a judging interval unit and a state machine. The first frequency detecting unit detects a reference frequency. The second frequency detecting unit detects an output frequency of the frequency dividing unit. The comparator receives and compares outputs of the first and the second frequency detecting units, and outputs a comparison result. The judging interval unit defines at least one judging period in a total comparison time, and enables the comparator to output the comparison result during the judging period. In a calibration mode, the state machine selects one of the capacitor configurations to set the VCO, and modify a fractional part from a target division ratio for obtaining a modified fraction according to a precision, and combines the modified fraction with an integer part of the target division ratio to set a division ratio of the frequency dividing unit. Wherein, the state machine selects another one of the capacitor configurations to set the VCO when the comparison result shows that the reference frequency does not match the output frequency of the frequency dividing unit.

The exemplary embodiment of the present disclosure provides an automatic frequency calibration method for a fractional-N frequency synthesizer. The automatic frequency calibration method can be described as follows. In a calibration mode, one of capacitor configurations is selected to set a VCO. In the calibration mode, a fractional part from a target division ratio is modified for obtaining a modified fraction according to a precision, and a division ratio of a frequency dividing unit is set according to the combination of the modified fraction and an integer part of the target division ratio. At least one judging period is defined in a total comparison time. In the calibration mode, a reference frequency and an output frequency of the frequency dividing unit are detected and compared during the judging period, so as to obtain a comparison result. In the calibration mode, another one of the capacitor configurations is selected to set the VCO when the comparison result shows that the reference frequency does not match the output frequency of the frequency dividing unit.

According to the above descriptions, the exemplary embodiment of the present disclosure provides an automatic frequency calibration circuit/method for a fractional-N frequency synthesizer. According to the automatic frequency calibration circuit/method, the fractional part of the target division ratio can be considered during the frequency calibration, so that during the comparison time, the VCO curve suitable for locking the frequency synthesizer can be quickly and effectively found.

In order to make the aforementioned and other features and advantages of the present disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
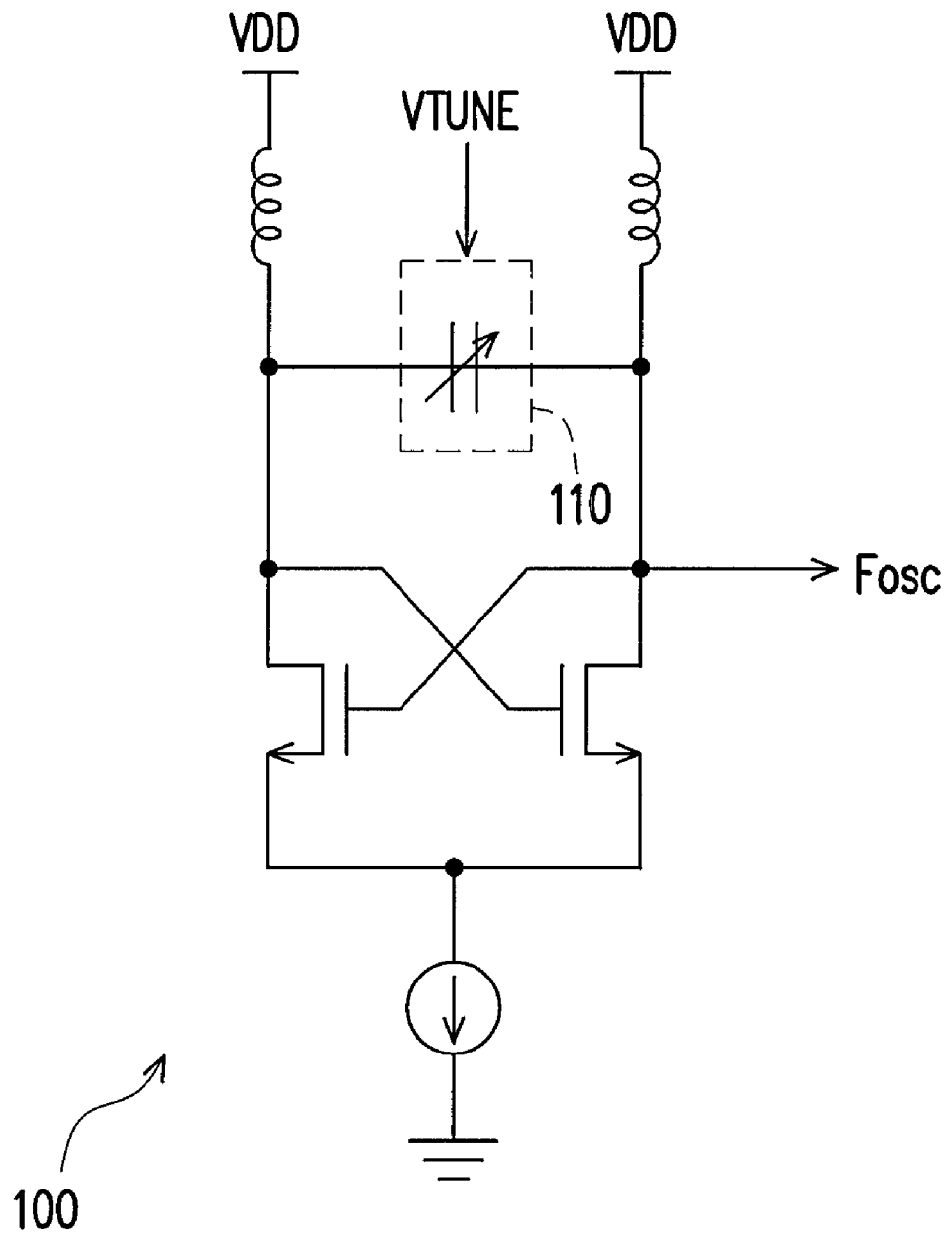
FIG. 1 is a circuit schematic diagram illustrating a voltage-controlled oscillator (VCO) of a conventional frequency synthesizer.
Figure 2A:
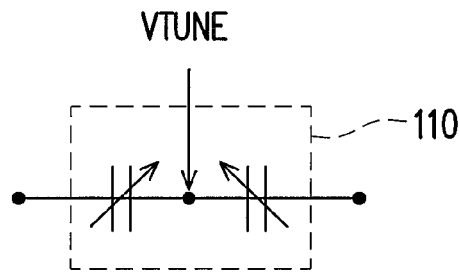
FIG. 2A is a circuit schematic diagram illustrating a varactor of a conventional VCO.
Figure 3A:
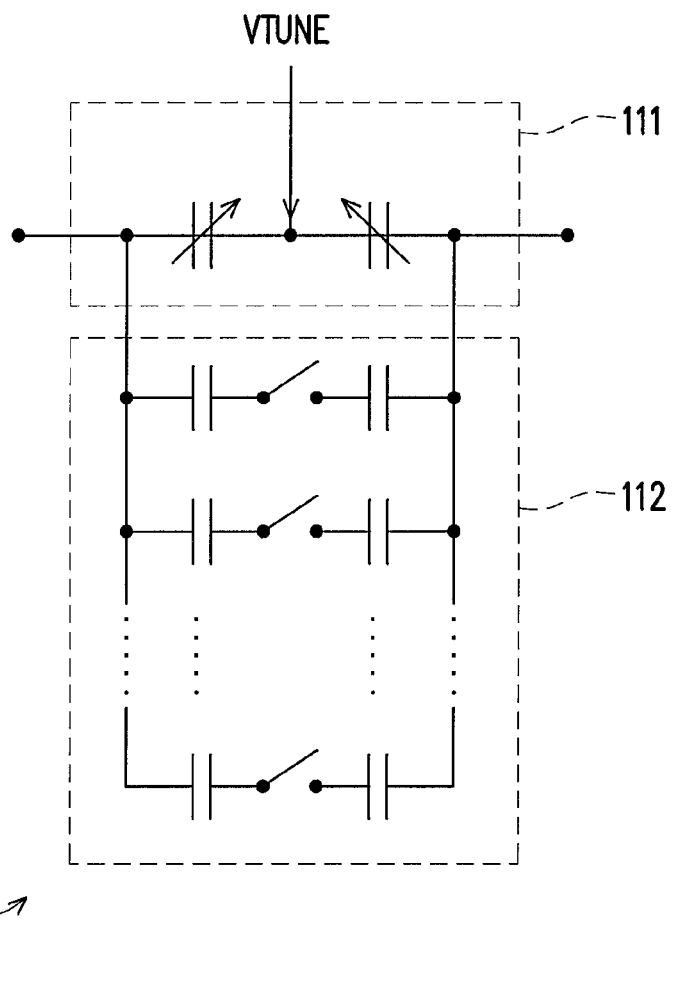
FIG. 3A is a circuit schematic diagram illustrating another varactor of a conventional VCO.
Figure 2B:
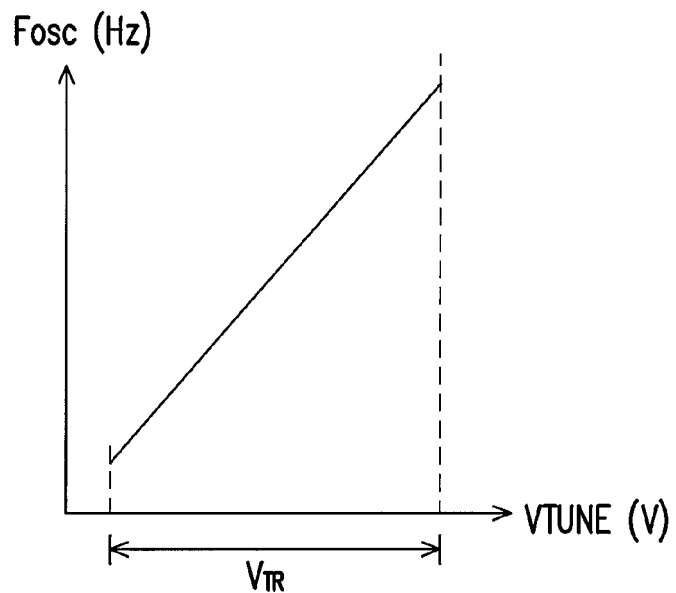
FIG. 2B is a schematic diagram illustrating a relationship curve of control voltages VTUNE and output frequencies Fosc in a large varactor of FIG. 2A.
Figure 3B:
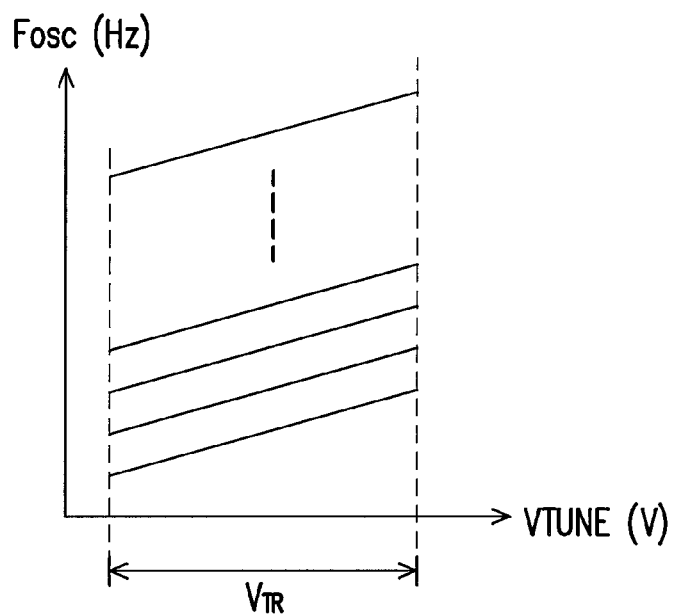
FIG. 3B is a schematic diagram illustrating relationship curves of control voltages VTUNE and output frequencies Fosc in a varactor of FIG. 3A.
Figure 4:
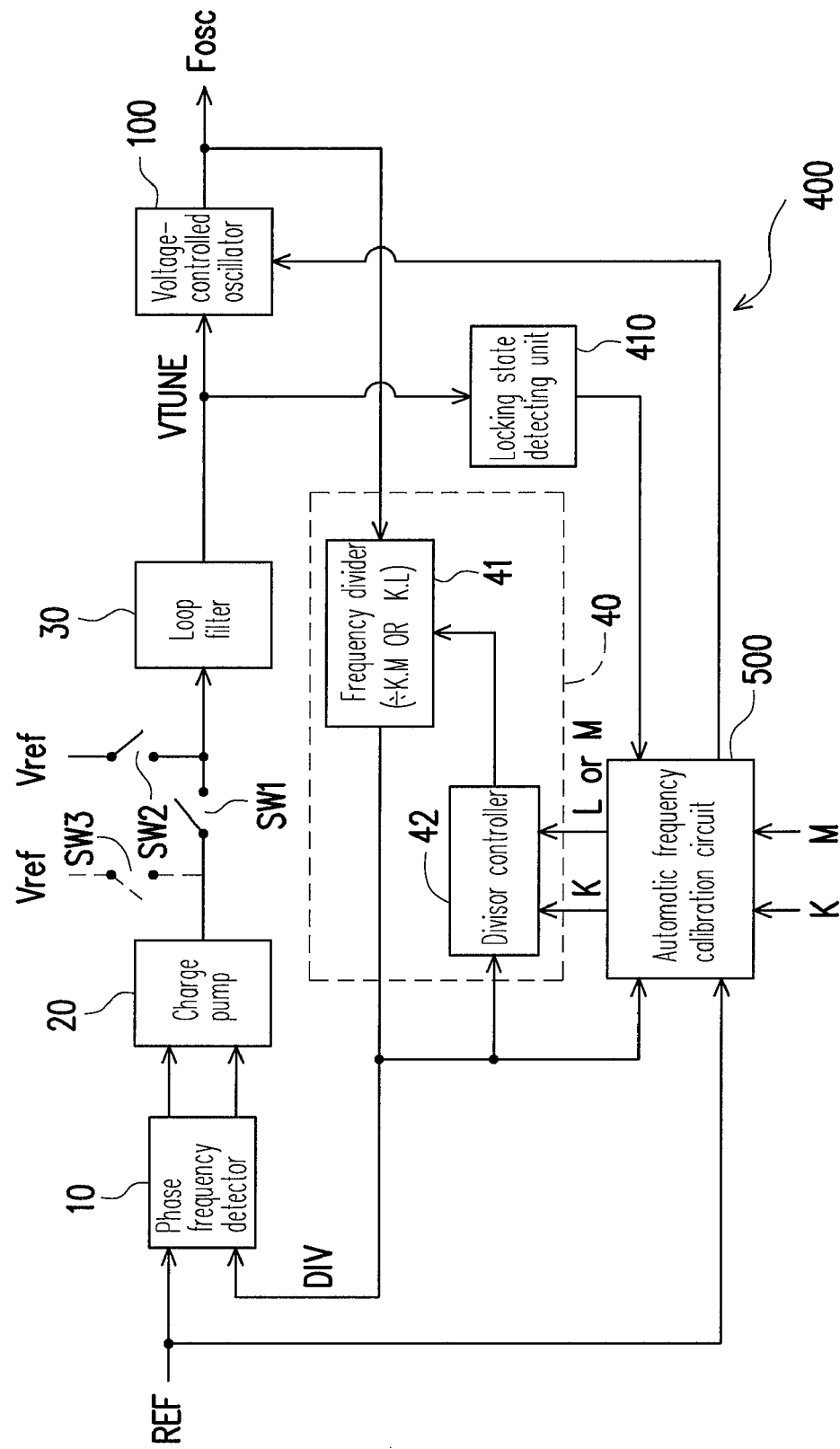
FIG. 4 is a functional block diagram illustrating a frequency synthesizer according to an exemplary embodiment of the present disclosure.

FIG. 4 is a functional block diagram illustrating a frequency synthesizer according to an exemplary embodiment of the present disclosure. The frequency synthesizer 400 includes a phase frequency detector (PFD) 10, a charge pump (CP) 20, a loop filter 30, a voltage-controlled oscillator 100, a frequency dividing unit 40 and an automatic frequency calibration circuit 500. The automatic frequency calibration circuit 500 can control a connecting state/connecting states of one or a plurality of switches of a switched-capacitor bank 112 within the VCO 100. Namely, the automatic frequency calibration circuit 500 can select one of capacitor configurations of the VCO 100 to set the VCO 100. The VCO 100 correspondingly generates an output frequency Fosc in response to a control voltage VTUNE. In the present exemplary embodiment, a first switch SW1 is disposed between the CP 20 and the loop filter 30, and a second switch SW2 and a third switch SW3 are disposed at two ends of the first switch SW1 as that shown in FIG. 4, though the third switch SW3 can be omitted according to an actual design requirement.

In a normal operation mode, the first switch SW1 is turned on, and the second switch SW2 and the third switch SW3 are turned off. Therefore, the frequency synthesizer 400 forms a loop to carry on frequency locking. The automatic frequency calibration circuit 500 can transmit a fraction part M and an integer part K of an external target division ratio to the frequency dividing unit 40, so as to set a division ratio of the frequency dividing unit 40 as K.M. The frequency dividing unit 40 performs a frequency dividing operation to the output frequency Fosc according to the target division ratio K.M provided by the automatic frequency calibration circuit 500, and then transmits a frequency-divided output frequency DIV to the PFD 10. In the present exemplary embodiment, the frequency dividing unit 40 includes a frequency divider 41 and a modulus controller 42. The modulus controller 42 can be implemented by any approach, for example, an integrator can be used to implement the modulus controller 42, or a delta-sigma modulator (ΔΣ modulator) can be used to implement the modulus controller 42. The modulus controller 42 can correspondingly adjust an integer division ratio of the frequency divider 41 according to the target division ratio K.M. By constantly adjusting the integer division ratio of the frequency divider 41, a fractional average of the output frequency DIV of the frequency divider 41 can be precisely adjusted to the target division ratio K.M. Implementations of the PFD 10, the CP 20, the loop filter 30, the VCO 100, the frequency divider 41 and the modulus controller 32 are well known by those skilled in the art, so that detailed descriptions thereof are not repeated.

In a calibration mode, the first switch SW1 is turned off, and the second switch SW2 and the third switch SW3 are turned on. Therefore, the frequency synthesizer 400 forms an open loop under the calibration mode, and a reference voltage Vref (a fixed voltage) is provided to the VCO 100 to serve as the control voltage VTUNE through the second switch SW2 and the loop filter 30. Namely, the control voltage VTUNE is fixed to a predetermined level (for example, a level of the reference voltage Vref). The level of the reference voltage Vref can be arbitrarily determined according to an actual design requirement. For example, the level of the reference voltage Vref can be set to a half of a system voltage VDD, wherein the system voltage VDD is the supply voltage in this frequency synthesizer 400.

In the calibration mode, the automatic frequency calibration circuit 500 can transmit the fraction part M and the integer part K of the target division ratio to the frequency dividing unit 40, so as to set the division ratio of the frequency dividing unit 40 as K.M. The frequency dividing unit 40 performs the frequency dividing operation to the output frequency Fosc according to the target division ratio K.M provided by the automatic frequency calibration circuit 500, and then transmits the frequency-divided output frequency DIV to the automatic frequency calibration circuit 500. The automatic frequency calibration circuit 500 can select one of the capacitor configurations of the VCO 100, and can determine whether a currently selected capacitor configuration is correct by comparing a frequency difference of frequency signals REF and DIV. If the frequency difference of the frequency signals REF and DIV exceeds a predetermined range, the automatic frequency calibration circuit 500 selects another one of the capacitor configurations to set the VCO 100 until the frequency difference of the frequency signals REF and DIV falls in the predetermined range. The other one of the capacitor configurations can be selected according to a linear search rule or a binary search rule. If the correct capacitor configuration is found, the calibration mode is ended, and the normal operation mode is resumed.

Assuming the fractional part M of the target division ratio has N bits, generally, if the modulus controller 42 is implemented by the delta-sigma modulator, $2^{N+1}$ periods are required to generate a correct equivalent fractional division ratio, so that a time for the automatic frequency calibration circuit 500 comparing the frequency signals REF and DIV has to be an integer multiple of $2^{N+1}$ periods, so as to avoid generating an error fraction. To reduce a calibration time of the calibration mode, the automatic frequency calibration circuit 500 can obtain the first n bits of the fractional part M of the target division ratio according to the rounding rule, and omit the remaining bits to obtain an approximate fractional part L. In the binary system, 0 is omitted and 1 is counted according to the rounding rule. For example, assuming the first 2 bits of the fractional part M are fetched to generate the approximate fractional part L, if the fractional part M is 10001, the approximate fractional part L is then 10000, and if the fractional part M is 10101, the approximate fractional part L is then 11000. In the calibration mode, the automatic frequency calibration circuit 500 can transmit the approximate fractional part L to the modulus controller 42 to generate a control signal to the frequency divider 41.

After the automatic frequency calibration circuit 500 uses the rounded division ratio K.L to accomplish selecting the correct tuning curve to end the calibration mode, the division ratio is set back to the original target value K.M, and afterwards a locked state detecting unit 410 is used to determine whether the control voltage VTUNE correctly falls in a tolerable range $V_{TR}$, and then the automatic frequency calibration circuit 500 adjusts the capacitor configuration of the VCO 100 according to a determination result of the locked state detecting unit 410. If the control voltage VTUNE is greater than the tolerable range $V_{TR}$, it represents that the currently selected capacitor configuration of the VCO 100 provides exceeded capacitance (for example, a relationship curve Bank#2 of FIG. 6), so that the automatic frequency calibration circuit 500 changes to select another configuration that leads to less capacitance (for example, a relationship curve Bank#3 of FIG. 6). If the control voltage VTUNE is smaller than the tolerable range $V_{TR}$, it represents that the currently selected capacitor configuration of the VCO 100 provides insufficient capacitance (for example, a relationship curve Bank#4 of FIG. 6), so that the automatic frequency calibration circuit 500 changes to select another configuration that results in more capacitance (for example, a relationship curve Bank#3 of FIG. 6). The modification operation of the locked state detecting unit 410 and the automatic frequency calibration circuit 500 is continuously carried on under the normal operation mode to detect if any sudden change in VTUNE or terminated after VTUNE is located within the tolerable range $V_{TR}$.

Figure 5:
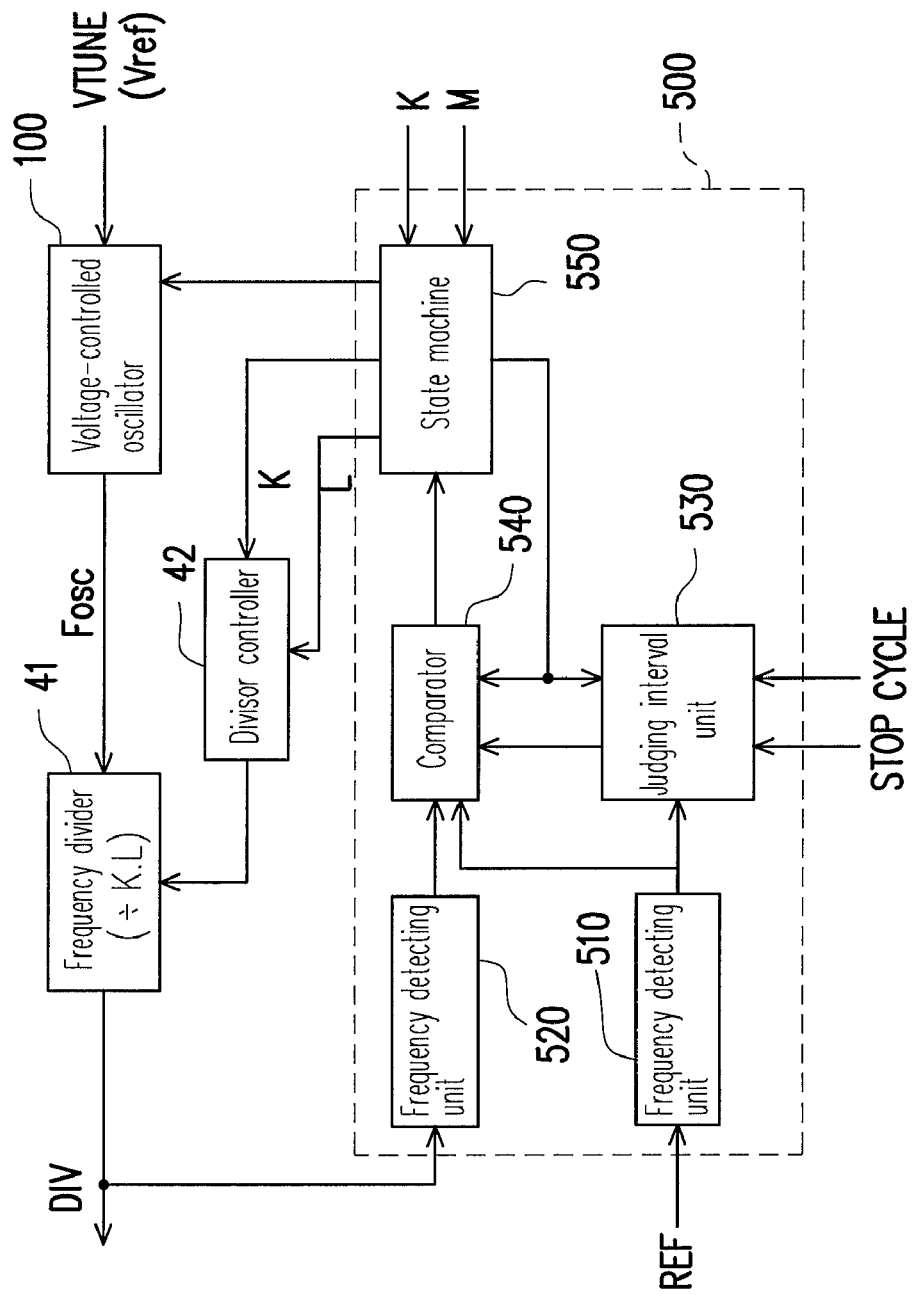
FIG. 5 is a diagram illustrating an exemplary embodiment of an automatic frequency calibration circuit of FIG. 4.

FIG. 5 is a diagram illustrating an exemplary embodiment of the automatic frequency calibration circuit 500 of FIG. 4. The automatic frequency calibration circuit 500 includes a first frequency detecting unit 510, a second frequency detecting unit 520, a judging interval unit 530, a comparator 540 and a state machine 550. In the normal operation mode, the state machine 550 sets the division ratio of the frequency dividing unit as K.M according to the fractional part M and the integer part K of the target division ratio provided from external.

In the calibration mode, the frequency synthesizer 400 forms the open loop, and the control voltage VTUNE is set to the reference voltage Vref (the fixed voltage). The first frequency detecting unit 510 detects the reference frequency REF. The second frequency detecting unit 520 detects the output frequency DIV of the frequency dividing unit 40. In the present exemplary embodiment, the first frequency detecting unit 510 includes a first counter, and the second frequency detecting unit 520 includes a second counter. The first counter and the second counter can respectively count a pulse number N1 of the reference frequency REF and a pulse number N2 of the output frequency DIV during a unit time, so that the first and the second frequency detecting units 510 and 520 can obtain frequency values of the reference frequency REF and the output frequency DIV.

The comparator 540 receives the outputs of the first and the second frequency detecting units 510 and 520. The judging interval unit 530 defines one or a plurality of judging periods in a total comparison time STOP, and enables the first counter and the second counter to respectively count the pulse number of the reference frequency REF and the pulse number of the output frequency DIV during each of the judging periods. When each of the judging periods is ended, the judging interval unit 530 enables the comparator 540 to compare the outputs of the first and the second frequency detecting units 510 and 520, and enables the comparator 540 to output a comparison result to the state machine 550.

In the calibration mode, the state machine 550 selects one of the capacitor configurations of the VCO 100 to set the VCO 100. The state machine 550 receives the fractional part M and the integer part K of the target division ratio provided by external, and modify the fractional part M from the target division ratio for obtaining a modified fraction (i.e. the approximate fractional part L) according to a required precision CYCLE, and then combines the modified fraction L with the integer part K of the target division ratio to set the division ratio of the frequency dividing unit 40. Wherein, the state machine 550 selects another one of the capacitor configurations to set the VCO 100 when the comparison result output by the comparator 540 shows that the reference frequency REF does not match the output frequency DIV of the frequency dividing unit 40.

Figure 6:
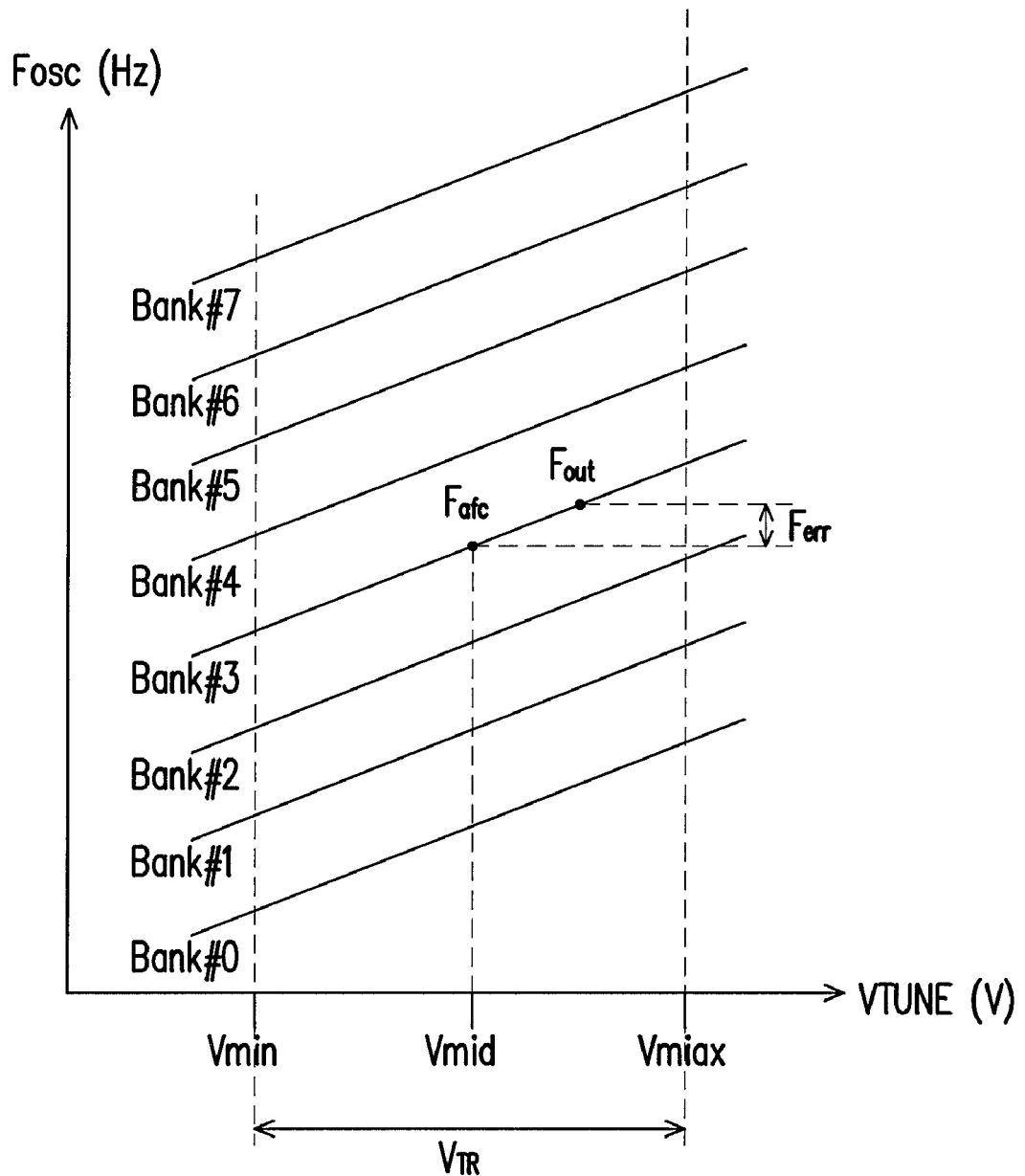
FIG. 6 is a diagram illustrating relationship curves of control voltages VTUNE and output frequencies Fosc of a VCO of FIG. 5.

The precision CYCLE represents a number of bits to be obtained from the fractional part M. A method of determining the precision CYCLE is as follows. Assuming the state machine 550 obtains the first n bits of the fractional part M according to the rounding rule, and omits the remaining bits to obtain the approximate fractional part L. Selection of the value n is determined according to FIG. 6. FIG. 6 is a diagram illustrating relationship curves of the control voltages VTUNE and the output frequencies Fosc of the VCO 100 of FIG. 5. Voltages Vmin and Vmax define the tolerable range $V_{TR}$ of the control voltage VTUNE for acceptable phase noise performance, and in the calibration mode, the control voltage VTUNE is fixed to a middle value Vmid of the tolerable range $V_{TR}$. The relationship curves Bank#0, Bank#1, Bank#2, ..., Bank#7 of FIG. 6 respectively correspond to one of the capacitor configurations of the VCO 100.

Assuming a frequency found by the automatic frequency calibration circuit 500 according to the modified fractional division ratio K.L from the first n bits is $F_{afc}$, a target frequency to be actually locked by the frequency synthesizer 400 is $F_{out}$, a slope (i.e. the oscillator gain) of the relationship curve between the control voltage VTUNE and the output frequency Fosc is $K_{VCO}$, the reference frequency is REF, the tolerable range of the control voltage VTUNE is $V_{TR}$, and a difference between the target frequency $F_{out}$ and the frequency $F_{afc}$ is $F_{err}$, following equations are then obtained:

$$F_{out} = (K.M) \times REF \quad (1)$$

$$F_{afc} = (K.L) \times REF \quad (2)$$

$$|F_{err}| = |F_{out} - F_{afc}| = |(0.M) - (0.L)| \times REF \leq (1/2^{n+1}) \times REF \quad (3)$$

According to the equation (3), it is known that a maximum of the frequency difference $F_{err}$ can be $\pm REF/2^{n+1}$. To ensure that the target frequency $F_{out}$ falls in an adjustable frequency range of the control voltage VTUNE, namely, to ensure the target frequency $F_{out}$ falls in a range of $K_{VCO} \times V_{TR}$, a following condition is required to be satisfied:

$$K_{VCO} \times V_{TR} \geq 2 \times REF/2^{n+1} \quad (4)$$

The slope $K_{VCO}$ and the tolerable range $V_{TR}$ are determined by a characteristic of the VCO 100, and the reference frequency REF is determined according to an actual design requirement. A most suitable n value can be obtained according to the slope $K_{VCO}$ of the relationship curve, the tolerable range $V_{TR}$ and the reference frequency REF through the equation (4).

Figure 7:
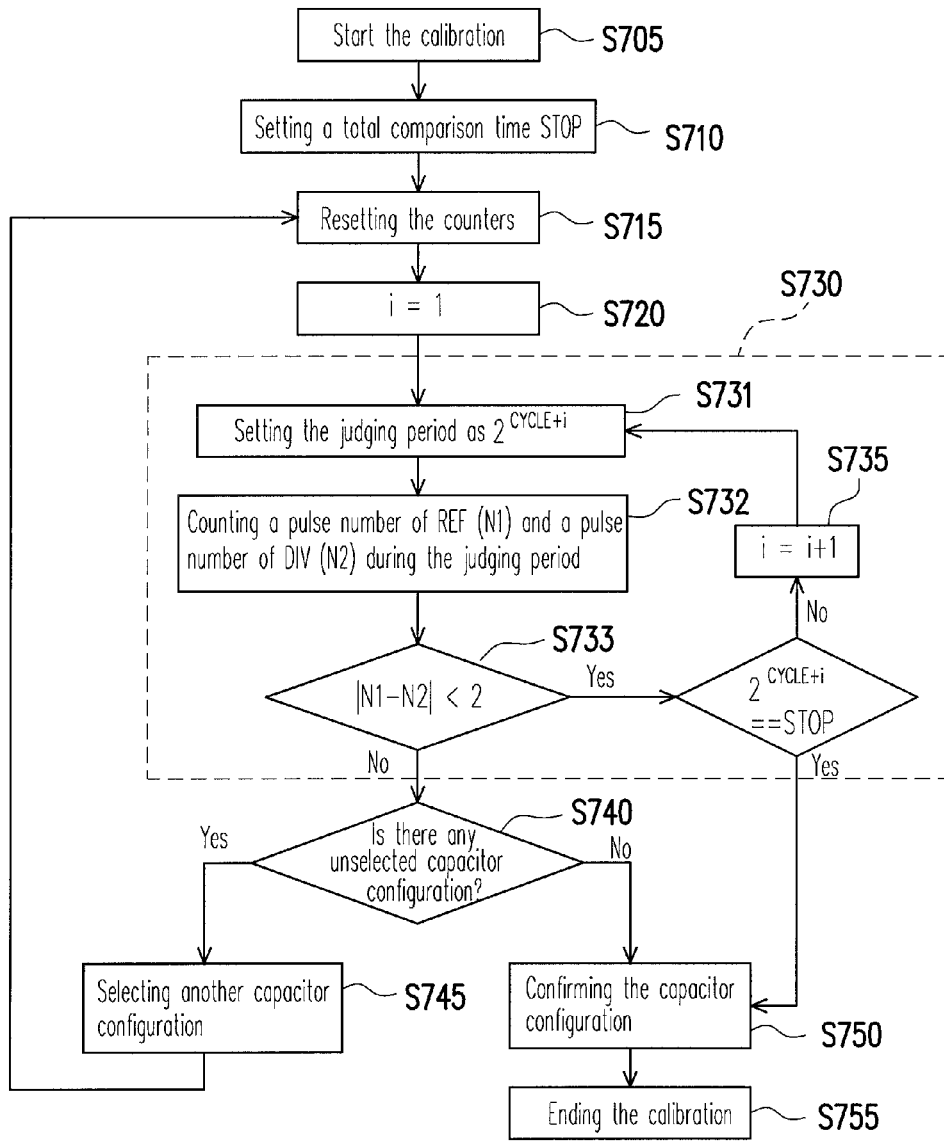
FIG. 7 is a flowchart illustrating an automatic frequency calibration method according to an exemplary embodiment of the present disclosure.

FIG. 7 is a flowchart illustrating an automatic frequency calibration method according to an exemplary embodiment of the present disclosure. Referring to FIG. 5 and FIG. 7, regarding the frequency comparison of the present exemplary embodiment, the pulse numbers of the reference frequency REF and the frequency-divided output frequency DIV are compared within a specific time (the judging period), so as to determine the frequency difference. When the state machine 550 enters the calibration mode (step S705), the switch SW1 is turned off, and the switch SW2 is turned on. The state machine 550 obtains the front n bits from the fractional part M of the target division ratio according to the precision CYCLE, and sets a division ratio of the frequency dividing unit 40 as K.L according to the front n bits (the approximate fractional part L) and the integer part K of the target division ratio.

In step S710, the judging interval unit 530 sets the total comparison time STOP. In step S715, the counters of the first frequency detecting unit 510 and the second frequency detecting unit 520 are reset. In step S720, the state machine 550 resets an index i, for example, resets the index i to 1. In step S730, the judging interval unit 530 defines at least one judging period in the total comparison time STOP, and the comparator 540 detects and compares the reference frequency REF and the output frequency DIV of the frequency dividing unit 40 during the judging period. In the total comparison time STOP, if the comparison result shows that the reference frequency REF matches the output frequency DIV of the frequency dividing unit 40, the current capacitor configuration is determined to be an optimal capacitor configuration (step S750), and the calibration mode is ended (step S755).

If the comparison result of the step S730 shows that the reference frequency REF does not match the output frequency DIV of the frequency dividing unit 40, the state machine 550 determines whether any unselected candidate capacitor configuration exists in the capacitor configurations of the VCO 100 (step S740), and selects another one of the capacitor configurations (step S745), and the steps S715-S740 are repeated. In the step S745, the state machine 550 uses the binary search rule to select the next candidate capacitor configuration. In the step S740, if it is determined that there is none of the possible capacitor configuration, the state machine 550 can confirm that the previous selected capacitor configuration is already the optimal capacitor configuration (step S750). After the capacitor configuration of the VCO 100 is determined, the state machine 550 ends the calibration mode and resumes the normal operation mode (step S755).

The step S730 includes steps S731-S735. In the step S731, the judging interval unit 530 defines at least one judging period in the total comparison time STOP, and sets the judging period to be $2^{CYCLE+i}$. Since the state machine 550 obtains a modified bits L from the fractional part M of the target division ratio according to the precision CYCLE, the modulus controller 42 requires $2^{CYCLE+1}$ periods (or an integer multiple of the $2^{CYCLE+1}$ periods) to generate a correct equivalent fractional division ratio, so that the judging period set by the step S731 has $2^{CYCLE+i}$ periods.

In the step S732, the counters of the first frequency detecting unit 510 and the second frequency detecting unit 520 respectively count the pulse number N1 of the reference frequency REF and the pulse number N2 of the frequency-divided output frequency DIV during the judging period set by the step S731. In the step S733, the comparator 540 transmits a difference of the pulse numbers N1 and N2 (i.e. |N1−N2|) to the state machine 550 after the judging period is ended, and the state machine 550 detects and compares the difference |N1−N2| with a threshold.

Since the first frequency detecting unit 510 and the second frequency detecting unit 520 are not synchronized, the state machine 50 changes the capacitor configuration of the VCO 100 when the difference between the pulse number N1 of the reference frequency REF and the pulse number N2 of the frequency-divided output frequency DIV is greater than or equal to 2, so as to avoid misjudgment caused by phase difference. Therefore, in the step S733, it is determined whether the difference |N1−N2| is smaller than 2, and if it is determined that the difference |N1−N2| is greater than or equal to 2 according to the step S733, it represents that the currently selected capacitor configuration is not the optimal capacitor configuration, so that the step S740 is executed to find a next capacitor configuration. If it is determined that the difference |N1−N2| is smaller than 2 according to the step S733, the index i is added by 1 (the step S735), and then the steps S731-S733 are repeated until $2^{CYCLE+i}$ is equal to the total comparison time STOP. Namely, a smaller judging period is first used to detect the difference between the pulse numbers N1 and N2, and under a condition that |N1−N2| is smaller than 2, the judging period is gradually increased to again detect the difference between the pulse numbers N1 and N2 until the judging period $2^{CYCLE+i}$ is equal to the total comparison time STOP. Therefore, if the current capacitor configuration is incorrect, the automatic frequency calibration circuit 500 can immediately end the detection operation to select a next capacitor configuration. If a situation that the difference between the pulse numbers N1 and N2 is greater than or equal to 2 is not occurred after the total comparison time STOP, it represents that the automatic frequency calibration circuit 500 has found the most suitable tuning curve (the capacitor configuration) (the step S750). In this case, the switch SW1 is turned on and the switches SW2 and SW3 are turned off, so that the frequency synthesizer 400 ends the calibration mode and enters a phase-locked loop (PLL) stage (step S755).

In summary, the exemplary embodiment of the present disclosure provides the automatic frequency calibration circuit 500 for a fractional-N frequency synthesizer. The bit number n required to be considered in the calibration mode during the automatic frequency calibration can be obtained according to the reference frequency REF of the frequency synthesizer 400 and the control voltage range $V_{TP}$ of the VCO 100. Therefore, the VCO curve (the capacitor configuration) suitable for locking the synthesizer 400 can be quickly and effectively found within the total comparison time STOP.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. An automatic frequency calibration circuit for a frequency synthesizer, the frequency synthesizer having a voltage-controlled oscillator (VCO) and a frequency dividing unit, wherein the VCO has a plurality of capacitor configurations, the automatic frequency calibration circuit comprising:
   a first frequency detecting unit, detecting a reference frequency;
   a second frequency detecting unit, detecting an output frequency of the frequency dividing unit;
   a comparator, receiving and comparing outputs of the first frequency detecting unit and the second frequency detecting unit, and outputting a comparison result;
   a judging interval unit, defining at least one judging period in a total comparison time, and enabling the comparator to output the comparison result during the judging period; and
   a state machine, selecting one of the capacitor configurations to set the VCO in a calibration mode, modifying a fractional part from a target division ratio for obtaining a modified fraction according to a precision, and combining the modified fraction with an integer part of the target division ratio to set a division ratio of the frequency dividing unit, wherein the state machine selects another one of the capacitor configurations to set the VCO when the comparison result shows that the reference frequency does not match the output frequency of the frequency dividing unit.

2. The automatic frequency calibration circuit as claimed in claim 1, wherein in a normal operation mode, the state machine sets the division ratio of the frequency dividing unit according to the fractional part and the integer part of the target division ratio.

3. The automatic frequency calibration circuit as claimed in claim 1, wherein in the calibration mode, a control voltage of the VCO is set as a reference voltage.

4. The automatic frequency calibration circuit as claimed in claim 3, wherein a level of the reference voltage is a half of a system voltage.

5. The automatic frequency calibration circuit as claimed in claim 1, wherein the first frequency detecting unit comprises a first counter, the second frequency detecting unit comprises a second counter, and the first counter and the second counter respectively count a pulse number of the reference frequency and a pulse number of the output frequency of the frequency dividing unit during the judging period.

6. The automatic frequency calibration circuit as claimed in claim 5, wherein the comparison result shows that the reference frequency does not match the output frequency of the frequency dividing unit since a difference between outputs of the first counter and the second counter is greater than or equal to 2.

7. The automatic frequency calibration circuit as claimed in claim 1, wherein the state machine uses a binary search rule to select another one of the capacitor configurations.

8. The automatic frequency calibration circuit as claimed in claim 1, wherein in the total comparison time, if the comparison result shows that the reference frequency matches the output frequency of the frequency dividing unit, the calibration mode is ended.

9. The automatic frequency calibration circuit as claimed in claim 1, further comprising a locked state detecting unit coupled between a control terminal of the VCO and the automatic frequency calibration circuit, wherein in a normal operation mode, the locked state detecting unit determines whether a control voltage of the VCO falls in a tolerable range and the automatic frequency calibration circuit adjusts the capacitor configuration of the VCO according to a determination result of the locked state detecting unit.

10. An automatic frequency calibration method for a frequency synthesizer, the frequency synthesizer having a voltage-controlled oscillator (VCO) and a frequency dividing unit, wherein the VCO has a plurality of capacitor configurations, the automatic frequency calibration method comprising:
    in a calibration mode, selecting one of capacitor configurations to set the VCO;
    in the calibration mode, modifying a fractional part from a target division ratio for obtaining a modified fraction according to a precision, and combining the modified fraction with an integer part of the target division ratio to set a division ratio of the frequency dividing unit;
    defining at least one judging period in a total comparison time;
    in the calibration mode, detecting and comparing a reference frequency and an output frequency of the frequency dividing unit during the judging period, so as to obtain a comparison result; and
    in the calibration mode, selecting another one of the capacitor configurations to set the VCO when the comparison result shows that the reference frequency does not match the output frequency of the frequency dividing unit.

11. The automatic frequency calibration method as claimed in claim 10, further comprising:
    in a normal operation mode, setting the division ratio of the frequency dividing unit according to the fractional part and the integer part of the target division ratio.

12. The automatic frequency calibration method as claimed in claim 10, further comprising:
    in the calibration mode, setting a control voltage of the VCO as a reference voltage.

13. The automatic frequency calibration method as claimed in claim 12, wherein a level of the reference voltage is a half of a system voltage.

14. The automatic frequency calibration method as claimed in claim 10, wherein the step of detecting the reference frequency and the output frequency of the frequency dividing unit comprises:

respectively counting a pulse number of the reference frequency and a pulse number of the output frequency of the frequency dividing unit during the judging period.

15. The automatic frequency calibration method as claimed in claim 14, wherein the comparison result shows that the reference frequency does not match the output frequency of the frequency dividing unit since a difference between the pulse number of the reference frequency and the pulse number of the output frequency of the frequency dividing unit is greater than or equal to 2.

16. The automatic frequency calibration method as claimed in claim 10, wherein the step of selecting another one of the capacitor configurations comprises using a binary search rule to select another one of the capacitor configurations.

17. The automatic frequency calibration method as claimed in claim 10, further comprising:
   in the total comparison time, ending the calibration mode if the comparison result shows that the reference frequency matches the output frequency of the frequency dividing unit.

18. The automatic frequency calibration method as claimed in claim 10, further comprising:
   in a normal operation mode, determining whether a control voltage of the VCO falls in a tolerable range, so as to obtain a determination result; and
   adjusting the capacitor configuration of the VCO according to the determination result.

* * * * *